(12) United States Patent
Okamura

(10) Patent No.: US 7,141,458 B2
(45) Date of Patent: Nov. 28, 2006

(54) SEMICONDUCTOR DEVICE AND METHOD OF MANUFACTURING THE SAME

(75) Inventor: Tomohiro Okamura, Minato-ku (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/041,971

(22) Filed: Jan. 26, 2005

(65) Prior Publication Data

US 2005/0189590 A1 Sep. 1, 2005

(30) Foreign Application Priority Data

Feb. 27, 2004 (JP) .............................. 2004-055244

(51) Int. Cl.
*H01L 21/84* (2006.01)
(52) U.S. Cl. ...................... 438/151; 438/300
(58) Field of Classification Search ........ 438/151–166, 438/300
See application file for complete search history.

(56) References Cited

U.S. PATENT DOCUMENTS 6,074,938 A 6/2000 Asamura 6,621,123 B1 * 9/2003 Nakabayashi et al. ...... 257/347

FOREIGN PATENT DOCUMENTS

JP 2000/150806 A 5/2000

OTHER PUBLICATIONS

R. Chau et al. "A 50 nm Depleted-Substrate CMOS Transistor (DST)," IDEM 2001, pp. 621-624.

* cited by examiner

*Primary Examiner*—Richard A. Booth
(74) *Attorney, Agent, or Firm*—Shinjyu Global IP

(57) ABSTRACT

A method of manufacturing a semiconductor device includes a step of forming a device region 5 that is separated by a device-separation insulating film 4 formed in a part of an SOI layer, a step of forming a gate insulating film 6a on a device region 5 so that the device region 5 can be exposed on both sides of the gate insulating film 6a, a step of forming a gate electrode 7a with polysilicon on the gate insulating film 6a, a step of adjusting the area of exposed silicon so that the area of exposed silicon can be a prescribed area by forming at least either a pseudo region 5b or a pseudo electrode 7b to control the growth rate in growing an epitaxial layer 9, and a step of conducting low-temperature epitaxial growth of silicon.

18 Claims, 17 Drawing Sheets

Part with High Pattern Ratio

Part with Low Pattern Ratio

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same. More specifically, the present invention relates to a semiconductor device that includes a device formed in a semiconductor layer on an insulating film, and a method of manufacturing the same.

2. Background Information

Related examples of a semiconductor device that include an MOS transistor formed with a semiconductor process are described in Japanese Patent Publications JP-A-2000-150806 and JP-A-11-003992, which are hereby incorporated by reference.

Japanese Patent Publication JP-A-2000-150806 discloses a semiconductor device, which includes device-separation insulating films, an active region, a pseudo region, a gate electrode, a pseudo conductive film, and an interlayer insulating film. The device-separation insulating films are buried in trenches formed on a surface of a semiconductor substrate of a bulk. The active region and the pseudo region are separated by a device-separation insulating film on a surface of a semiconductor substrate. The gate electrode is formed on an active region. The pseudo conductive film is formed on a device-separation insulating film at almost the same height with a gate electrode. The interlayer insulating film covers the gate electrode and the pseudo conductive film. In the semiconductor device, the pseudo region inhibits occurrence of erosion, for which the active region is excessively polished, and of dishing, for which the insulating film in a trench is excessively polished at the middle.

The device-separation insulating film is formed by the following steps. That is, the device-separation insulating film is buried in trenches that are formed on a surface of the semiconductor substrate of the bulk, and then the insulating film is polished by the CMP method so that the insulating film remains only in the trenches. If the area of the active region is too small compared to the area of the trench in polishing the device-separation insulating film, there is a possibility that excessive of erosion may occur in the polish in the active region compared to the polish in the insulating film. Also, in polishing the device-separation insulating film that is buried in a wide trench, there is a possibility dishing might occur in the thickness of the device-separation insulating film as the middle gets thinner than at the edges.

Accordingly, the semiconductor device inhibits the occurrence of erosion and dishing by increasing the substantive area of the active region by forming a pseudo region and decreasing the area of the trench at the same time.

In addition, the pseudo-conductive film improves planarization of the interlayer insulating film. In conducting planarization of the interlayer insulating film that covers the gate electrode by polishing it with the CMP method, polishing speed highly depends on a difference of elevation of a substrate pattern. In a part that there are few gate electrodes, the difference of elevation in the substrate pattern enlarges and polishing speed in the interlayer insulating film varies inside the film because a gate electrode is a part that projects from an active region. Therefore, the difference in elevation in the substrate is reduced by making the part projecting from an active region dense by allocating a pseudo electrode that has a similar height with the gate electrode.

Japanese Patent Publication JP-A-11-003992 also discloses a semiconductor device in which a pseudo region (a dummy device region) and a pseudo conductive film (a dummy gate electrode) are formed, as described in Japanese Patent Publication JP-A-2000-150806. Furthermore, in the semiconductor device, a dummy electrode has an electrical interconnection with a pseudo region in order to prevent a state in which the dummy gate electrode is in a state of floating. To put it concretely, a part of the dummy gate electrode is formed on a pseudo region, and the dummy gate electrode and the pseudo region are connected by a titanium silicide layer.

By the way, in recent years, an MOS transistor can be manufactured with a Silicon on Insulator (SOI) substrate to reduce power consumption. Especially, power consumption is effectively reduced with a full depletion layer type SOI, which inhibits the short channel effect by making an SOI layer (a semiconductor layer on an insulating film) thin and is operated in a full depletion layer. In a full depletion layer type SOI, sheet resistance increases because thickness of an SOI layer is formed at 50 nanometers or less. Accordingly, R. Chau et al., in "A 50 nm depleted-substrates CMOS transistor (DST)," IEDM 2001, pp. 621–624, which is hereby incorporated by reference, describes a method of reducing sheet resistance by forming a source drain that is thicker than a channel layer by epitaxial growth of silicon in the source drain.

In conducting epitaxial growth of silicon on an extremely thin SOI layer, such as an SOI layer in a full depletion layer type SOI, silicon in the SOI layer agglutinates when epitaxial growth is conducted at a general growth temperature (e.g., 800 degrees C.). Therefore, epitaxial growth has to be conducted at a low temperature (e.g., 700 degrees C. or below) so that the SOI layer does not agglutinate. However, the inventor of the present invention found that growth rate depends more on the density of silicon that is exposed on a substrate pattern than other growth conditions such as gas concentration or pressure.

FIGS. 1(a) to 1(c) a diagrams illustrating a part with high pattern ratio of silicon and a part with low pattern ratio of silicon in a semiconductor wafer. Here, the pattern ratio of silicon means a proportion of an area of silicon that is exposed on a substrate to epitaxial growth of silicon to the total area of the substrate. A growth rate v is expressed in a formula v/v0, on the basis of the growth rate v/0 when the pattern ratio is 100%. FIG. 1(b) is a diagram illustrating a part with a high pattern ratio of silicon in the semiconductor wafer. The part surrounded by an outside rectangle shows the whole of a part with high pattern ratio of silicon in the semiconductor wafer. Further black parts show a part of silicon that is exposed. The pattern ratio of the part with a high pattern ratio is a proportion of the area of the black parts to the area of the whole of the part with the high pattern ratio surrounded by the outside rectangle. For example, the pattern ratio of the part with high pattern ratio of silicon is 80% or more. FIG. 1(c) is a diagram illustrating a part with a low pattern ratio of silicon in a semiconductor wafer. The part surrounded by an outside rectangle shows the whole of a part with a low pattern ratio of silicon in the semiconductor wafer. Further, the black part shows the part of silicon that is exposed. The pattern ratio in a part with low pattern ratio of silicon is a proportion of the area of a black part to the area of the whole of the part with a low pattern ratio surrounded by the outside rectangle. For example, the pattern ratio in a part with the low pattern ratio of silicon is 10% or less.

FIGS. 2(a) and 2(b) are charts illustrating a growth rate of silicon for the x-axis and the y-axis in low-temperature epitaxial growth. As shown in FIG. 1(a), horizontal axes, x and y in FIGS. 2(a) and 2(b), are used to show coordinates of the x-axis and y-axis arranged such that the middle of a wafer is set to be the origin. In both the x-axis and y-axis, a coordinate value on the edge of a part of that chip is formed to be set to one. In the charts, a measurement result in a part with high pattern ratio is obtained when the whole of the wafer is the part with high pattern ratio (pattern ratio is 80% or greater), and a measurement result in the part with a low pattern ratio is obtained when the whole of the wafer is a part with a low pattern ratio (pattern ratio is 10% or less). Also, in the measurement, the growth rate is measured by conducting epitaxial growth of silicon with a Vapor Phase Epitaxy (VPE) method. Epitaxial growth is conducted at 730 degrees C. of atmosphere temperature by using $SiH_2Cl_2$ as gas to grow silicon and HCl as a gas to conduct etching of silicon that adheres to a device-separation insulating film.

In reference to FIGS. 2(a) and 2(b), it is obvious that the growth rate in the low-temperature epitaxial growth of silicon decelerates in a part with a low pattern ratio of silicon (pattern ratio is 10% or less), compared to a part with a high pattern ratio of silicon (pattern ratio is 80% or more), when an identical process is used (i.e., when growth conditions such as gas used and atmosphere temperature are identical) and when growth rate is measured along the x-axis and y-axis.

Therefore, in conducting low-temperature epitaxial growth of silicon with the identical process, if the pattern ratio of silicon varies from place to place on an identical chip extra space, an identical wafer, or a plurality of wafers, that is, if the density of exposed silicon varies from place to place, the growth rate varies from place to place and the film thickness of the epitaxial layer is uneven because film thickness of the epitaxial layer is thicker in a part in which the density of exposed silicon is high than in a part in which the density of exposed silicon is low.

However, the problem of the growth rate in low-temperature epitaxial growth depending on the density of exposed silicon is described neither Japanese Patent Publications JP-A-2000-150806 and JP-A-11-003992, nor the nonpatent literature described above. Both Japanese Patent Publications JP-A-2000-150806 and JP-A-11-003992 describe a step of forming a pseudo conductive film and a pseudo region that are made of silicon. However, the pseudo conductive film makes a part that is projected from an SOI layer dense, and the pseudo region prevents a region of silicon in the SOI layer from being much smaller than that of a device-separation insulating film to inhibit occurrence of erosion and dishing in polishing a device-separation insulating film. Therefore, the pseudo conductive film and the pseudo region are not used to adjust the density of exposed silicon.

In view of the above, it will be apparent to those skilled in the art from this disclosure that there exists a need for an improved semiconductor device and method of manufacturing the same. This invention addresses this need in the art as well as other needs, which will become apparent to those skilled in the art from this disclosure.

SUMMARY OF THE INVENTION

A semiconductor device in accordance with the present invention includes a first insulating film, a first layer, a first electrode, an epitaxial layer, and a third region. The first layer is formed on the first insulating film, and includes a first region on which a second insulating film is formed, and a second region that is separated by the second insulating film and is made of a first substance. A third insulating film is formed so that the surrounding or periphery of the second region can be exposed on the second region. The first electrode is made of the first substance and is formed on the third insulating film. The epitaxial layer is made of the first substance and is formed on the second region that is exposed on the surroundings of the third insulating film. The third region is either a region that is made of the first substance and is formed on the surface of the second insulating film in a state such that its surface is exposed for epitaxial growth so that the exposed area of the first substance can be a prescribed area in order to control the growth rate in growing the epitaxial layer, or a third region that is made of the first substance and is buried in the second insulating film in a state such that its surface is exposed for epitaxial growth. Here, the surroundings of the second region that is exposed includes a case in which the surroundings of the second region is exposed on the third insulating film for the entire circumference, and a case in which the second region is exposed on a part of the surroundings of the third insulating film.

According to the semiconductor device, it is possible to control the growth rate of the first substance for epitaxial growth by forming either a third region that is made of the first substance and is formed on the surface of the second insulating film in a condition in which the surface is exposed for epitaxial growth, or a third region that is made of the first substance and is buried in the second insulating film in a condition such that the surface is exposed for epitaxial growth. The growth rate is also controlled by adjusting the exposed area of the first substance that is exposed on the substrate pattern for epitaxial growth. Further, if the area of exposed silicon is adjusted by the third region so that the density of exposed silicon can be uniform according to the layout for an identical chip, an identical wafer, or plurality of wafers for an identical process is conducted, it is possible to have a uniform growth rate on the identical chip, the identical wafer, or plurality of wafers on which the identical process is conducted and to have a uniform film thickness for the epitaxial layer.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

In a first preferred embodiment of the present invention, an area of exposed silicon is adjusted by forming a pseudo electrode on a device-separation insulating film.

Figure 1A:
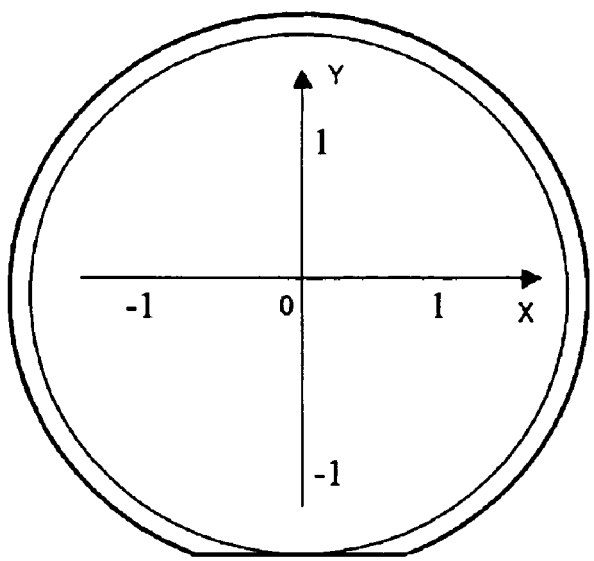
FIGS. 1(a) to 1(c) are views of diagrams illustrating a part with high pattern ratio of silicon in a semiconductor wafer and a part with low pattern ratio of silicon in a semiconductor wafer.
Figure 1B:
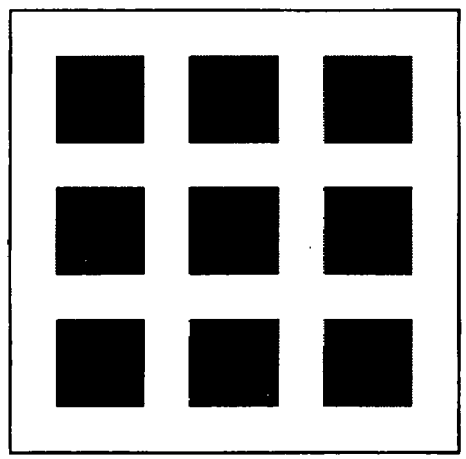
Figure 1C:
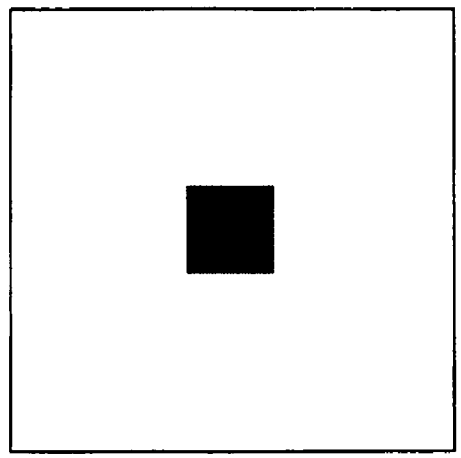
Figures 2A, 2B:
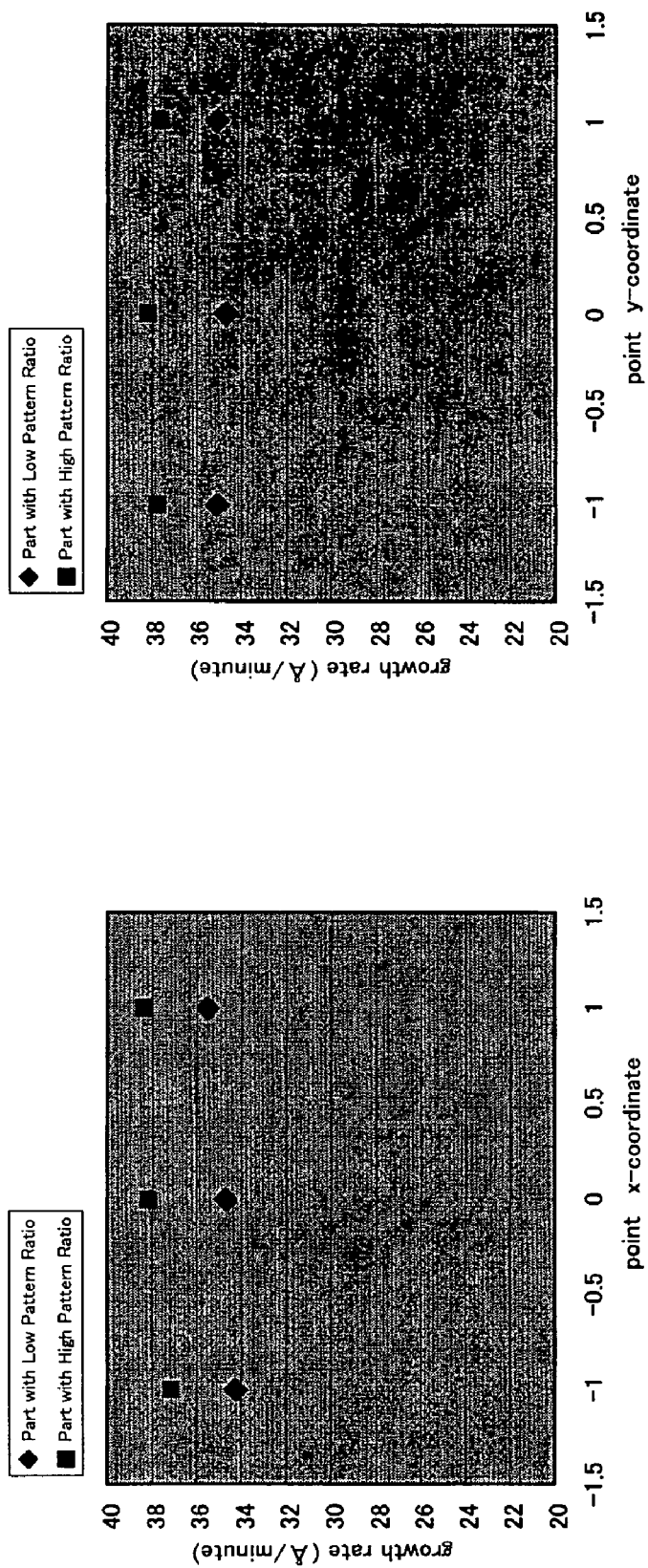
FIGS. 2(a) and 2(b) are views of charts illustrating growth rate of silicon along an x-axis and y-axis in a semiconductor wafer in low-temperature epitaxial growth.
Figure 3:
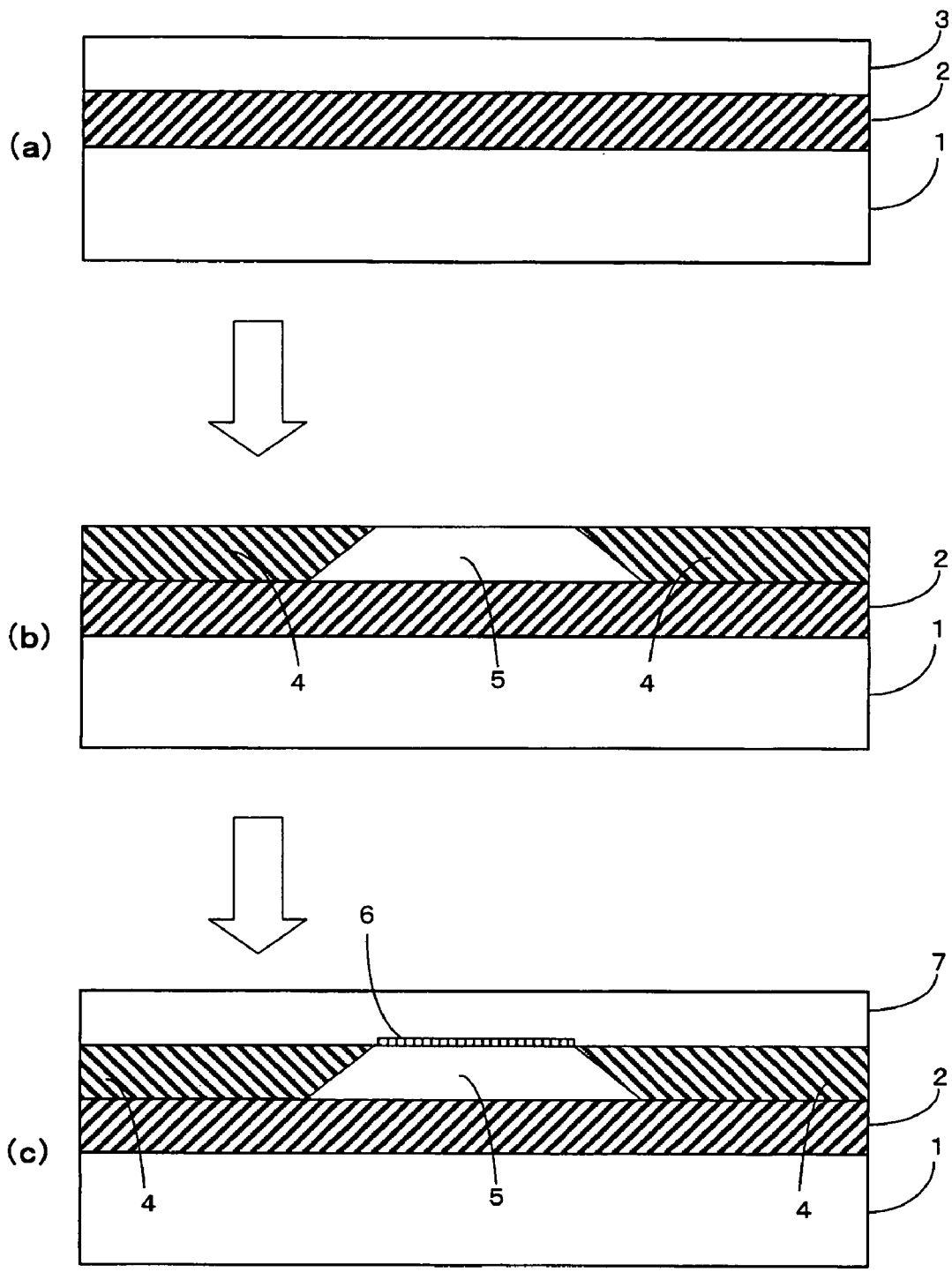
FIG. 3 is a view of cross-section diagrams illustrating a method of making a semiconductor device in accordance with a first embodiment of the present invention.
Figure 4:
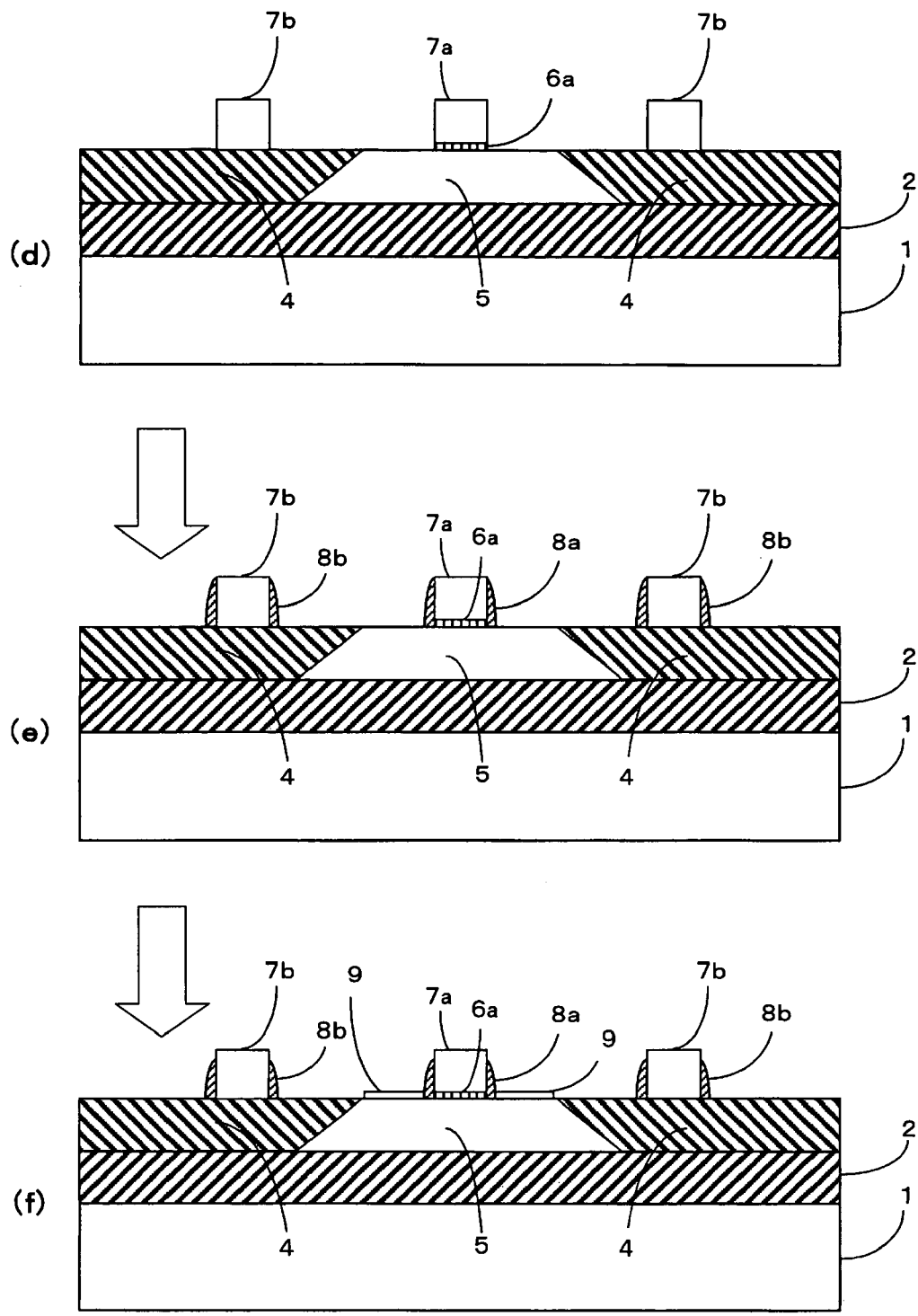
FIG. 4 is a view of cross-section diagrams further illustrating the method of making the semiconductor device in accordance with the first embodiment of the present invention.
Figure 5:
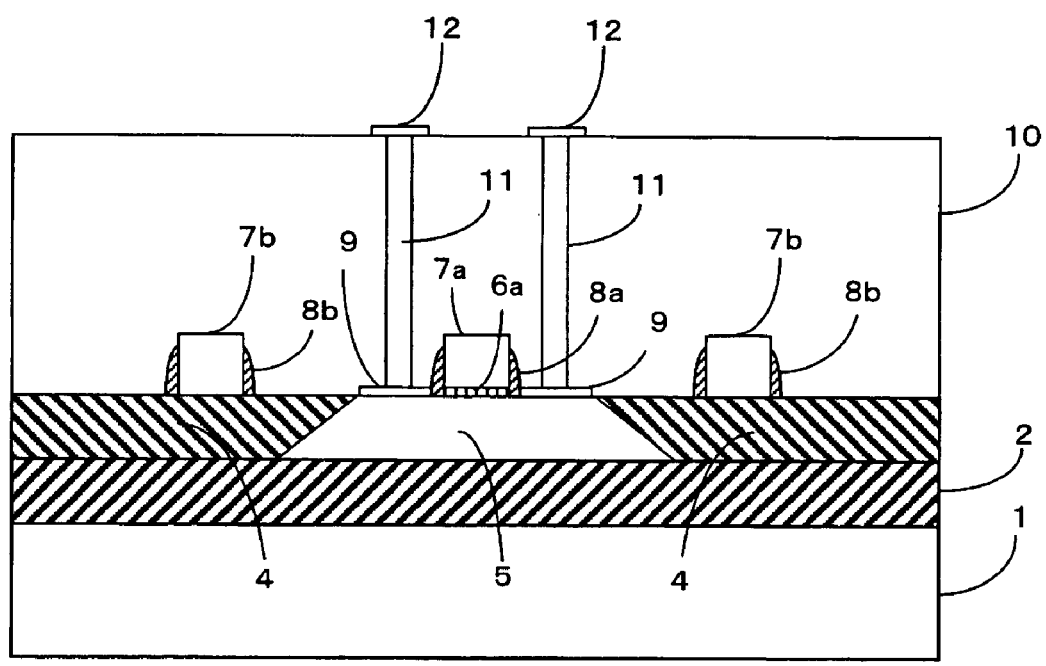
FIG. 5 is a view of a cross-section diagram illustrating the semiconductor device in accordance with the first embodiment of the present invention.

FIGS. 3 through 5 are views of cross-section diagrams illustrating a manufacturing method of an SOI semiconductor device in accordance with the first embodiment of the present invention. An example of the SOI semiconductor device is a full depletion layer type SOI semiconductor device that operates in a full depletion layer. In addition, the SOI semiconductor device can be a partial depletion layer type SOI semiconductor device. The present invention is especially effective for an SOI semiconductor device in which the SOI layer is extremely thinly formed (e.g., 50 nanometers or less), but it can be applied to any semiconductor device if it is manufactured by a manufacturing method including low-temperature epitaxial growth that is described below.

As shown in line (a) of FIG. 3, an SOI substrate, which is made of a silicon support substrate 1, an insulating film 2 that is a buried oxide film, and a semiconductor layer (an SOI layer) 3 that is made of a silicon single crystal, is prepared. An SOI substrate of the present invention is not restricted to the type of SOI substrate prepared here. Any type of SOI substrate can be used if it has a structure such that a silicon layer is formed on an insulating film. For example, a Silicon On Sapphire (SOS) substrate, which uses sapphire as an insulating film, can be used.

Next, as shown in line (b) of FIG. 3, silicon in the semiconductor layer 3 is partially oxidized by a heretofore known method of Local Oxidation of Silicon (LOCOS), and a device-separation insulating film 4, which is made of silicon oxide, is formed. Further, a device region 5, which is separated by the device-separation insulating film 4, is formed. For example, oxidization with the LOCOS method is conducted by selective oxidization in which a nitride film is used as a mask. The surface of the semiconductor layer 3 is thinly thermal-oxidized, and $Si_3N_4$ is deposited by a Chemical Vapor Deposition (CVD) method. A region in which the device-separation insulating film 4 is formed is opened by conducting patterning of $Si_3N_4$, and etching is conducted for half of the film thickness of the semiconductor layer 3 that is exposed on the opening part. Then, thermal oxidization is conducted, and a thermal oxidized film that exists in a place other than $Si_3N_4$ and the opening part is removed. Accordingly, the device-separation film 4 is formed.

Next, as shown in line (c) of FIG. 3, an insulating film 6 that is made of silicon oxide is formed on the surface of the device region 5, and a polysilicon layer 7 is deposited by the CVD method. The insulating film 6 is formed by a method, such as the thermal oxidation method.

Next, as shown in line (d) of FIG. 4, a gate insulating film 6a, a gate electrode 7a, and a pseudo electrode 7b are formed by conducting patterning of the polysilicon 7 and the insulating film 6. The pseudo electrode 7b is not required to operate a semiconductor device. An objective when forming the pseudo electrode 7b is to adjust the area of silicon exposed on the substrate (area of exposed silicon), that is, the pattern ratio, a proportion of the area of exposed silicon, so that the growth rate can be at a desired rate when conducting low temperature epitaxial growth by adding silicon in the source drain region (a part of the device region 5 exposed on both sides of the gate insulating film 6a) in a later step. An upper part of the gate electrode 7a and the part of the device region 5 that is exposed on both sides of the gate insulating film 6a and is changed to a source drain region are an area of exposed silicon. The area of exposed silicon is compensated by forming the pseudo electrode or electrodes 7b that are made of poly-silicon, if the exposed area of an upper side of the gate electrode 7a and the part of the device region 5 exposed on both sides of the gate insulating film 6a cannot sufficiently realize the desired growth rate. In other words, the exposed area of the pseudo electrode 7b is adjusted so that the area of exposed silicon on which an upper side of the gate electrode 7a, the source drain region, and the pseudo electrode 7b are combined can realize a desired growth rate in low-temperature epitaxial growth in a later step. The layout and area of the pseudo electrode 7b are decided so that the pattern ratio required to realize the prescribed growth rate can be obtained.

In addition, if the density of the exposed silicon varies from place to place on an identical chip, an identical wafer, or plurality of wafers for which the identical epitaxial growth is conducted, the density of exposed silicon is adjusted by the pseudo electrode 7b depending on the places, so that the density of exposed silicon can be uniform on the identical chip, the identical wafer, or plurality of wafers, and the pattern ratio to realize the desired growth rate can be obtained. The layout and area of the pseudo electrode 7b are decided so that the density of exposed silicon can be uniform on an identical chip, an identical wafer, or plurality of wafers, and the pattern ratio to realize the desired growth rate can be obtained.

Next, as shown in line (e) of FIG. 4, sidewalls 8a and 8b are respectively formed on sides of the gate electrode 7a and the pseudo electrode 7b by depositing a silicon nitride film or a silicon oxide film using a CVD method and then conducting etch back.

Next, as shown in line (f) of FIG. 4, epitaxial growth of silicon is conducted on a part of the device region 5 that is exposed on both sides of the gate insulating film 6a, and an epitaxial layer 9 is formed on the surface of a part of the device region 5 that is exposed on both sides of the gate insulating film 6a. As a result, the thickness of silicon on both sides of the gate insulating film 6a is made thicker by forming the epitaxial layer 9, which can reduce sheet resistance.

As an example of a method for epitaxial growth, a vapor phase epitaxy (VPE) method is used. With regards to growth conditions, for example, $SiCl_4$ is used as a gas to grow silicon, and $Cl_2$ is used as a gas to conduct etching for the silicon that adheres to a place such as the device-separation insulating film 4. Further, the atmosphere temperature is preferably set to 730 degrees C. As described above, in the epitaxial growth, the pattern ratio of silicon on substrate pattern is adjusted by the pseudo electrode 7b. Therefore, it is possible to control the growth rate of silicon and set it to a desired value. In addition, if the density of exposed silicon varies from place to place on an identical chip, an identical wafer, or a plurality of wafers on which the identical epitaxial growth is conducted, it is possible to prevent variability of the growth rate on the identical chip, the identical wafer, or plurality of wafers, and grow the epitaxial layer 9 with a uniform thickness at the uniform and desired growth rate. This is because the area of exposed silicon is adjusted by the pseudo electrode or electrodes 7b so that density of exposed silicon on the identical chip, the identical wafer, or plurality of wafers can be uniform and the pattern ratio to realize the desired growth rate can be obtained.

Further, in forming the epitaxial layer 9, epitaxial growth of silicon is conduced on an upper side of the gate electrode 7a and an upper side of the pseudo electrode 7b. Therefore film thickness, in which the film thickness of the polysilicon layer 7 and that of the epitaxial layer 9 are combined, is determined to be the same with the desired film thickness, in order to form an upper side of the electrode 7a and an upper side of the pseudo electrode 7b with the desired film thickness.

Next, a source drain region is formed on both sides of the gate insulating film 6a by implanting impurity ions into the epitaxial layer 9.

Then, as shown in FIG. 5, an interlayer insulating film 10 is formed by depositing silicon oxide or silicon nitride with a CVD method, and an opening that exposes the source drain region is formed. Further, at least one contact plug 11 that is connected to the source drain region and a wiring pattern 12 that is connected to the contact plug 11 are formed.

According to the SOI semiconductor device in accordance with the first embodiment of the present invention, it is possible to control the growth rate and set it to a desired rate by adjusting the area of silicon that is exposed on the substrate pattern, that is, area ratio of silicon (pattern ratio) with the pseudo electrode or electrodes 7b in low-temperature epitaxial growth to reduce sheet resistance.

Further, if the density of exposed silicon varies from place to place on an identical chip, an identical wafer, or a plurality of wafers in which identical epitaxial growth is conducted, the area of exposed silicon is adjusted by the pseudo electrode or electrodes 7b so that density of exposed silicon can be uniform on the identical chip, the identical wafer, or plurality of wafers and the pattern ratio to realize desired growth rate can be realized. Accordingly, it is possible to grow the epitaxial layer 9 with a uniform film thickness at a uniform and desired growth rate on the identical chip, the identical wafer, or plurality of wafers. Moreover, it is possible to control the growth rate of low-temperature epitaxial growth only by forming the pseudo electrode or electrodes 7b.

As used herein, the following directional terms "forward, rearward, above, downward, vertical, horizontal, below, and transverse" as well as any other similar directional terms refer to those directions of a device equipped with the present invention. Accordingly, these terms, as utilized to describe the present invention should be interpreted relative to a device equipped with the present invention.

Alternate Embodiments

Alternate embodiments will now be explained. In view of the similarity between the first and second embodiments, the parts of the alternate embodiments that are identical to the parts of the first embodiment will be given the same reference numerals as the parts of the first embodiment. Moreover, the descriptions of the parts of the alternate embodiments that are identical to the parts of the first embodiment may be omitted for the sake of brevity.

Second Embodiment

In a second preferred embodiment of the present invention, an area of exposed silicon is adjusted by forming a pseudo region on a device-separation insulating film.

Figure 6:
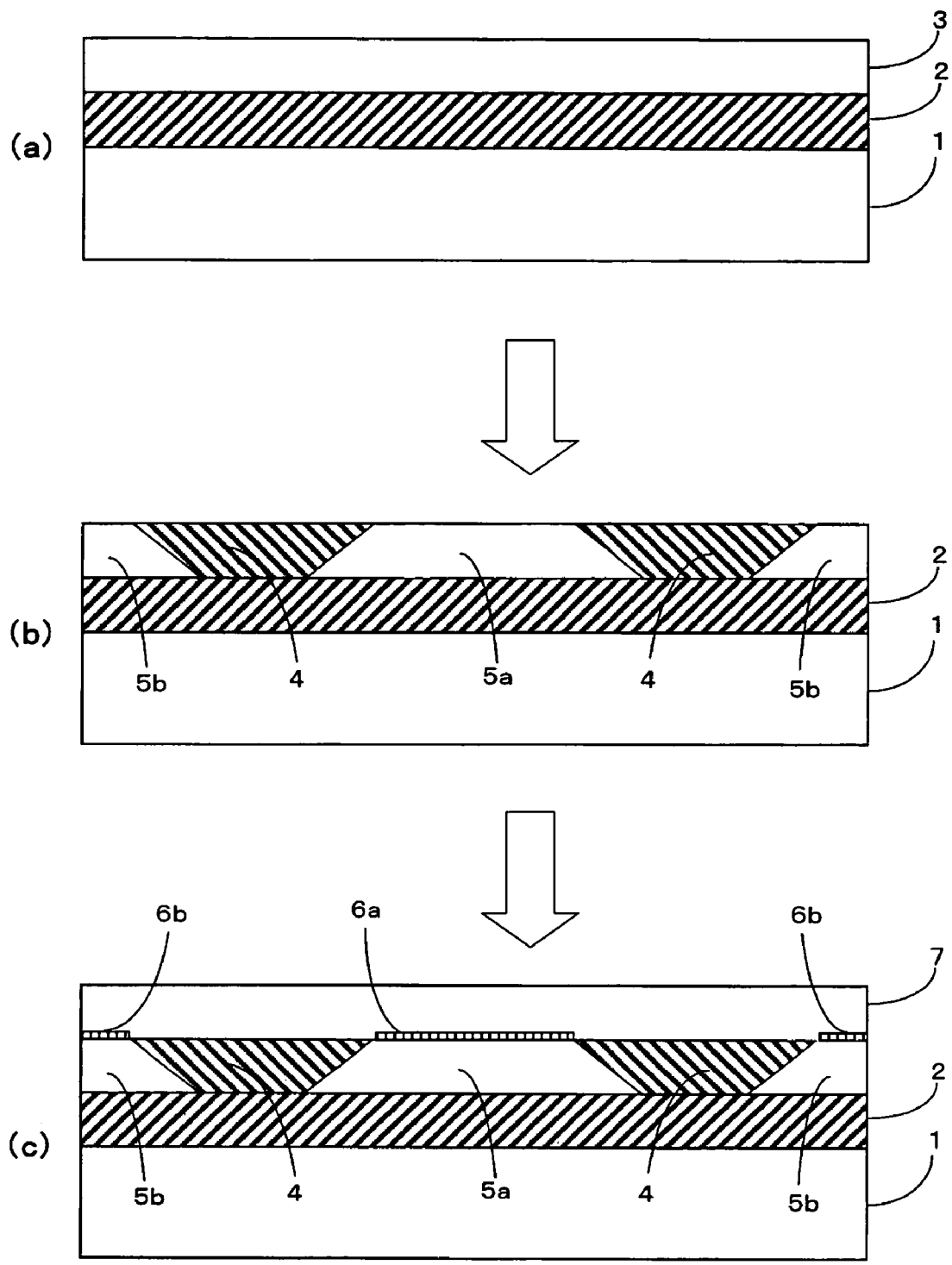
FIG. 6 is a view of cross-section diagrams illustrating a method of making a semiconductor device in accordance with a second embodiment of the present invention.

FIGS. 6 though 8 are cross-section diagrams used to explain a method of manufacturing an SOI semiconductor device in accordance with the second embodiment of the present invention.

As shown in line (a) of FIG. 6, an SOI substrate that is identical or similar to the one that is used in the first embodiment of the present invention is prepared.

Next, as shown in line (b) of FIG. 6, a device-separation insulating film 4, which is made of silicon oxide, is formed by locally oxidizing silicon in a semiconductor layer 3 with a heretofore known Local Oxidation of Silicon (LOCOS) method. However, in the present embodiment, a pseudo region or regions 5b are also formed in addition to a device region 5a, which is separated by the device-separation insulating film 4. The device region 5a is a region in which an MOS transistor is formed, and the pseudo region 5b is a region that is not required to operate a semiconductor device and the MOS transistor is not formed therein.

As described above, an upper side of a gate electrode 7a and a part of the device region 5a, which is exposed on both sides of a gate insulating film 6a and becomes a source drain region, are an area of exposed silicon. The area of exposed silicon is compensated by forming the pseudo region 5b if the exposed area of an upper side of the gate electrode 7a and a part of the device region 5a that is exposed on both sides of the gate insulating film 6a cannot sufficiently realize the desired growth rate. In other words, the exposed area of the pseudo electrode 7b is adjusted so that the area of exposed silicon in which an upper side of the gate electrode 7a, a part of the device region 5a exposed on both sides of the gate insulating film 6a, and the pseudo region 5b are combined can realize a desired growth rate for low-temperature epitaxial growth in a later step. The layout and area of the pseudo electrode 7b are decided so that the pattern ratio required to realize the prescribed growth rate can be obtained.

In addition, if the density of exposed silicon varies from place to place on an identical chip, an identical wafer, or plurality of wafers, on which the identical epitaxial growth is conducted the area of exposed silicon is adjusted by the pseudo region 5b depending on the places so that the density of the exposed silicon can be uniform on the identical chip, the identical wafer, or plurality of wafers. Further, the pattern ratio required to realize the prescribed growth rate can be obtained. The layout and area of a pseudo region 5b are decided so that the density of exposed silicon can be uniform on an identical chip, an identical wafer, or plurality of wafers, and the pattern ratio to realize desired growth rate can be obtained.

Next, as shown in line (c) of FIG. 6, insulating films 6a and 6b that are made of silicon oxide, are formed on the surface of the device region 5a and the pseudo region 5b, and a polysilicon layer 7 is deposited by a CVD method. The insulating films 6a and 6b are preferably formed by a method such as the thermal oxidation method.

Figure 7:
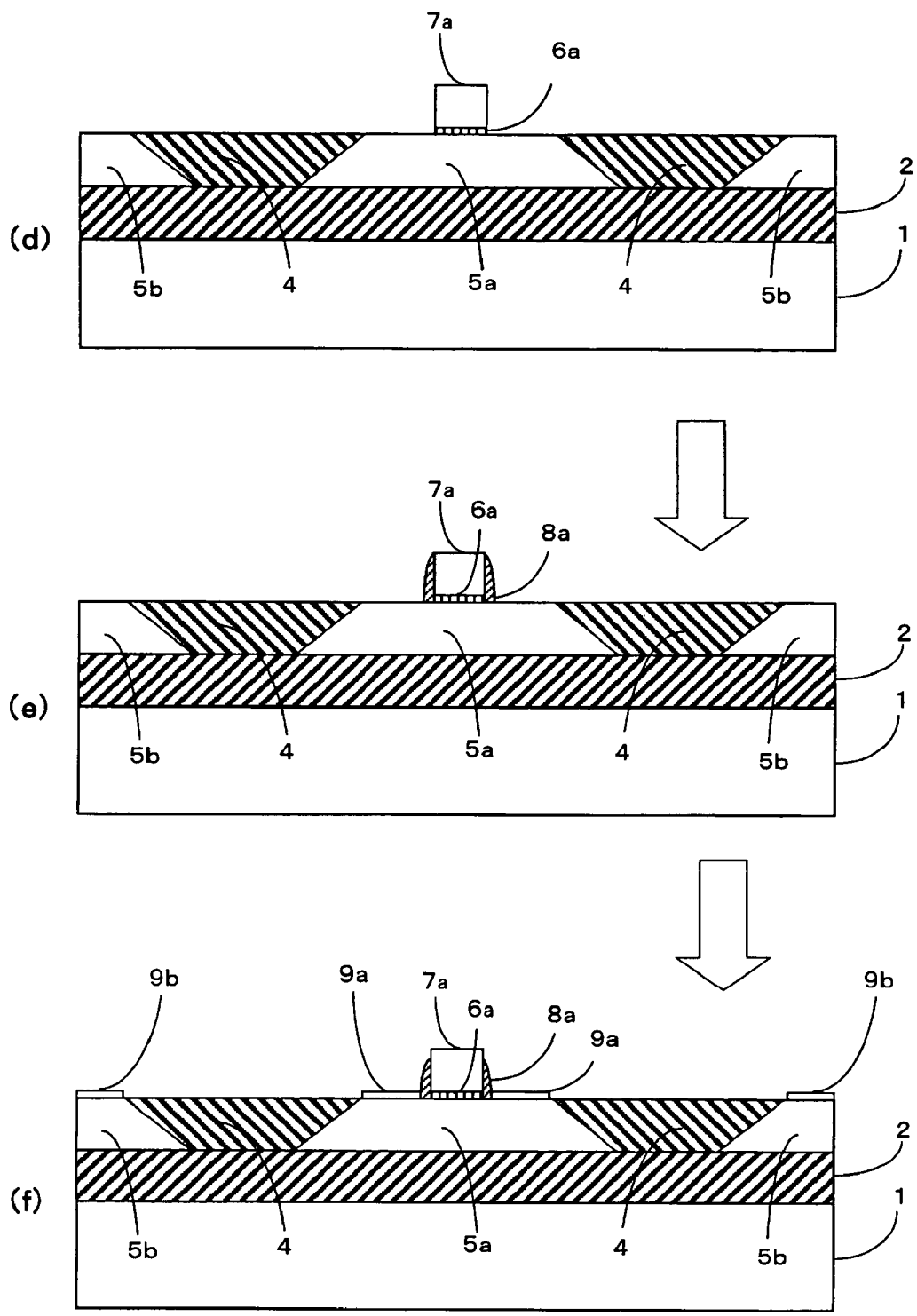
FIG. 7 is a view of cross-section diagrams further illustrating the method of making the semiconductor device in accordance with the second embodiment of the present invention.

Next, as shown in line (d) of FIG. 7, a gate insulating film 6a and the gate electrode 7a are formed by conducting patterning of the polysilicon layer 7 and insulating films 6a and 6b.

Next, as shown in line (e) of FIG. 7, a sidewall 8a is formed on the sides of the gate electrode 7a by depositing a silicon nitride film or a silicon oxide film by a CVD method and then conducting etch back.

Next, as shown in line (f) of FIG. 7, epitaxial growth of silicon is conducted on the surface of a part of the device region 5a that is exposed on both sides of the gate insulating film 6a and surface of the pseudo region 5b. Further, an epitaxial layer 9a is formed on the surface of a part of the device region 5a that is exposed on both sides of the gate insulating film 6a, and an epitaxial layer 9b is formed on the surface of the pseudo region 5b. The epitaxial layer 9a is formed to reduce sheet resistance by increasing the thickness of a source drain region. Epitaxial growth is preferably conducted using the growth conditions that are described in the first embodiment of the present invention.

As described above, the pattern ratio of the silicon on substrate pattern is adjusted by the pseudo region 5b in this epitaxial growth. Therefore, it is possible to control the growth rate of silicon and set it to a desired rate. In addition, if the density of exposed silicon varies from place to place on an identical chip, an identical wafer, or a plurality of wafers in which identical epitaxial growth is conducted, the area of exposed silicon is adjusted by the pseudo region 5b so that the density of exposed silicon can be uniform on an identical chip, an identical wafer, or plurality of wafers and the pattern ratio to realize the desired growth rate can be obtained. Therefore, it is possible to grow the epitaxial layer 9a with uniform film thickness at a uniform and desired growth rate on the identical chip, the identical wafer, or plurality of wafers.

Next, a source drain region is formed on both sides of the gate insulating film 6a by implanting impurity ions into the epitaxial layer 9a and heat-treating it.

Figure 8:
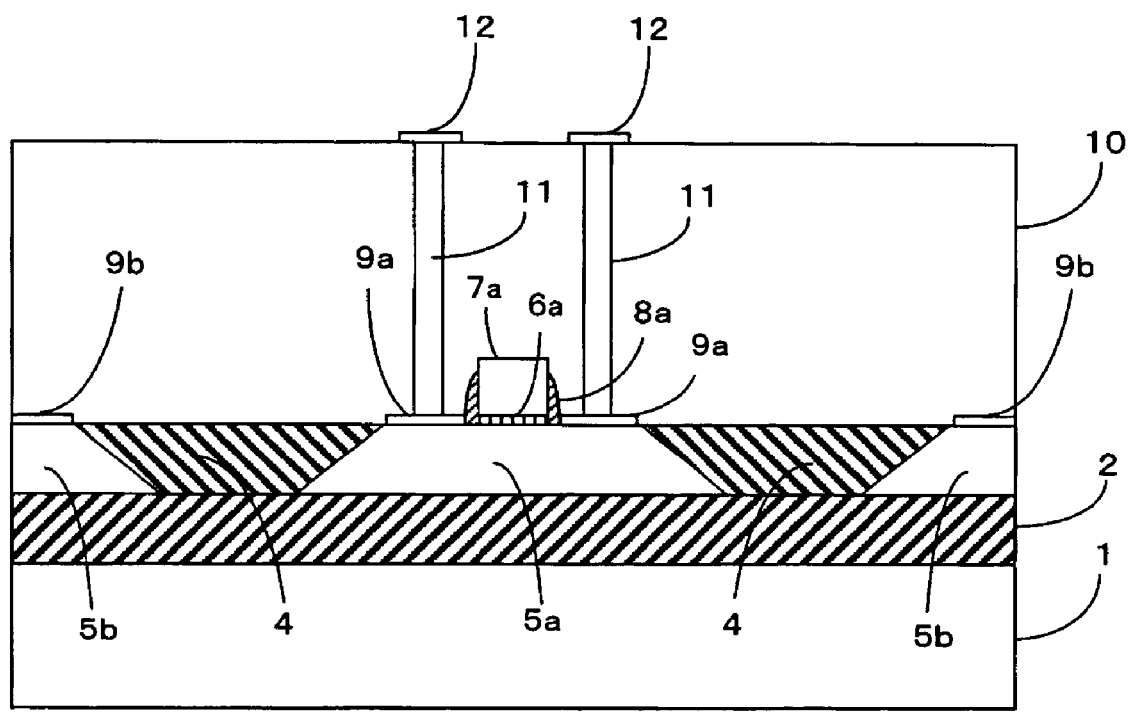
FIG. 8 is a view of a cross-section diagram illustrating the semiconductor device in accordance with the second embodiment of the present invention.

Then, as shown in FIG. 8, an inter-layer insulating film 10 is formed by depositing silicon oxide or silicon nitride using a CVD method, and an opening that exposes the source drain region is formed. Further, at least one contact plug 11 that is connected to the source drain region is formed, and a wiring pattern 12 that is connected to the contact plug 11 is formed.

According to the SOI semiconductor device in accordance with the second embodiment of the present invention, it is possible to adjust the area of exposed silicon that is exposed on the substrate pattern, that is, the area ratio of silicon (pattern ratio) by the pseudo region 5b in low-temperature epitaxial growth to reduce sheet resistance, and to control the growth rate and set it to a desired rate.

Further, if the density of exposed silicon varies from place to place on an identical chip, an identical wafer, or plurality of wafers in which identical epitaxial growth is conducted, the area of exposed silicon is adjusted by the pseudo region 5b so that the density of exposed silicon can be uniform on an identical chip, an identical wafer, or plurality of wafers and the pattern ratio to realize a desired growth rate can be obtained. Accordingly, it is possible to grow the epitaxial layer 9a with uniform film thickness at a uniform and desired growth rate on the identical chip, the identical wafer, or plurality of wafers. In addition, it is possible to adjust the area of exposed silicon and control the growth rate in low-temperature epitaxial growth only by forming the pseudo region 5b.

Third Embodiment

In a preferred third embodiment of the present invention, an area of exposed silicon is adjusted by forming both a pseudo electrode and a pseudo region on a device-separation insulating film.

Figure 9:
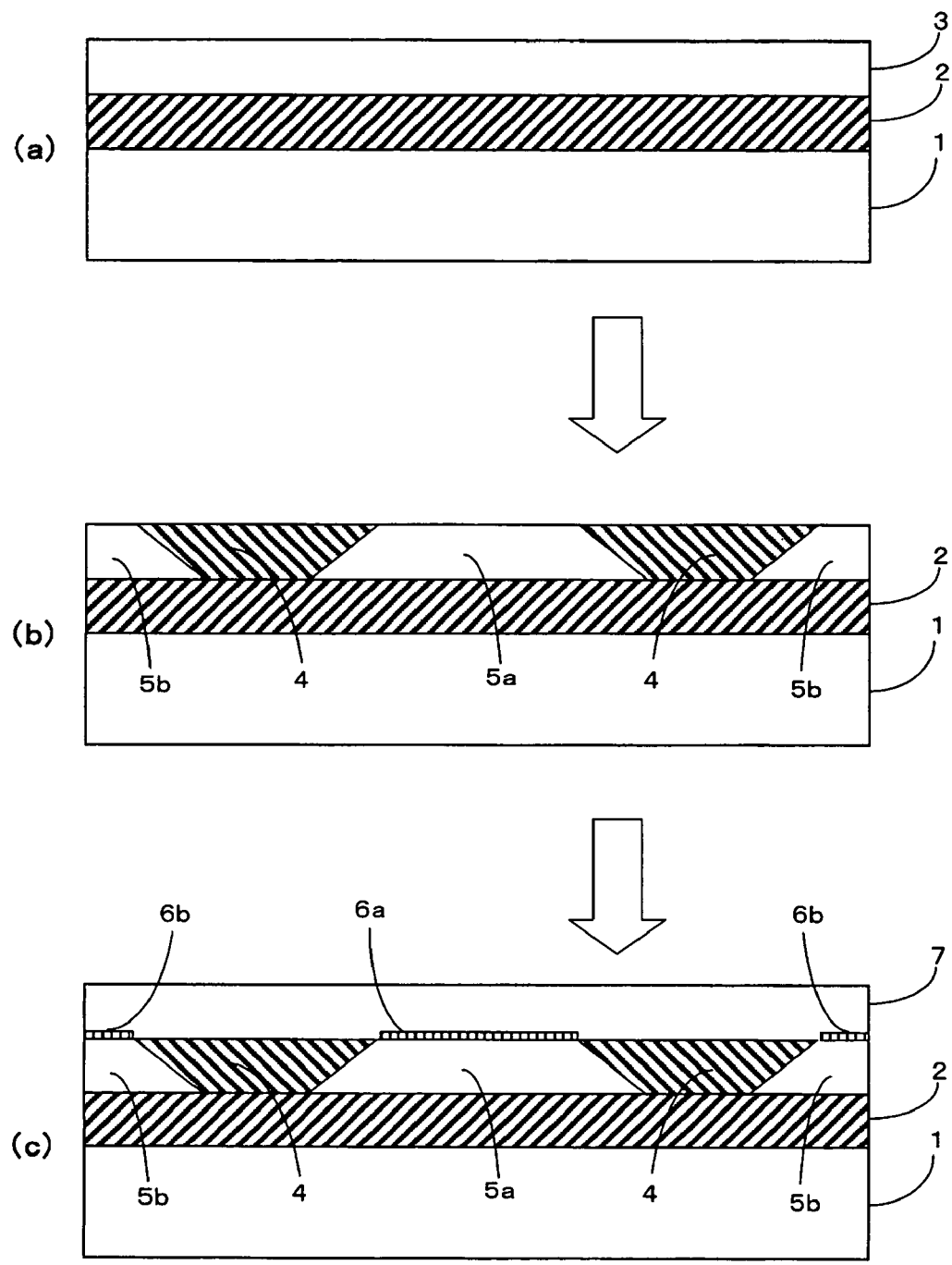
FIG. 9 is a view of cross-section diagrams illustrating a method of making a semiconductor device in accordance with a third embodiment of the present invention.
Figure 10:
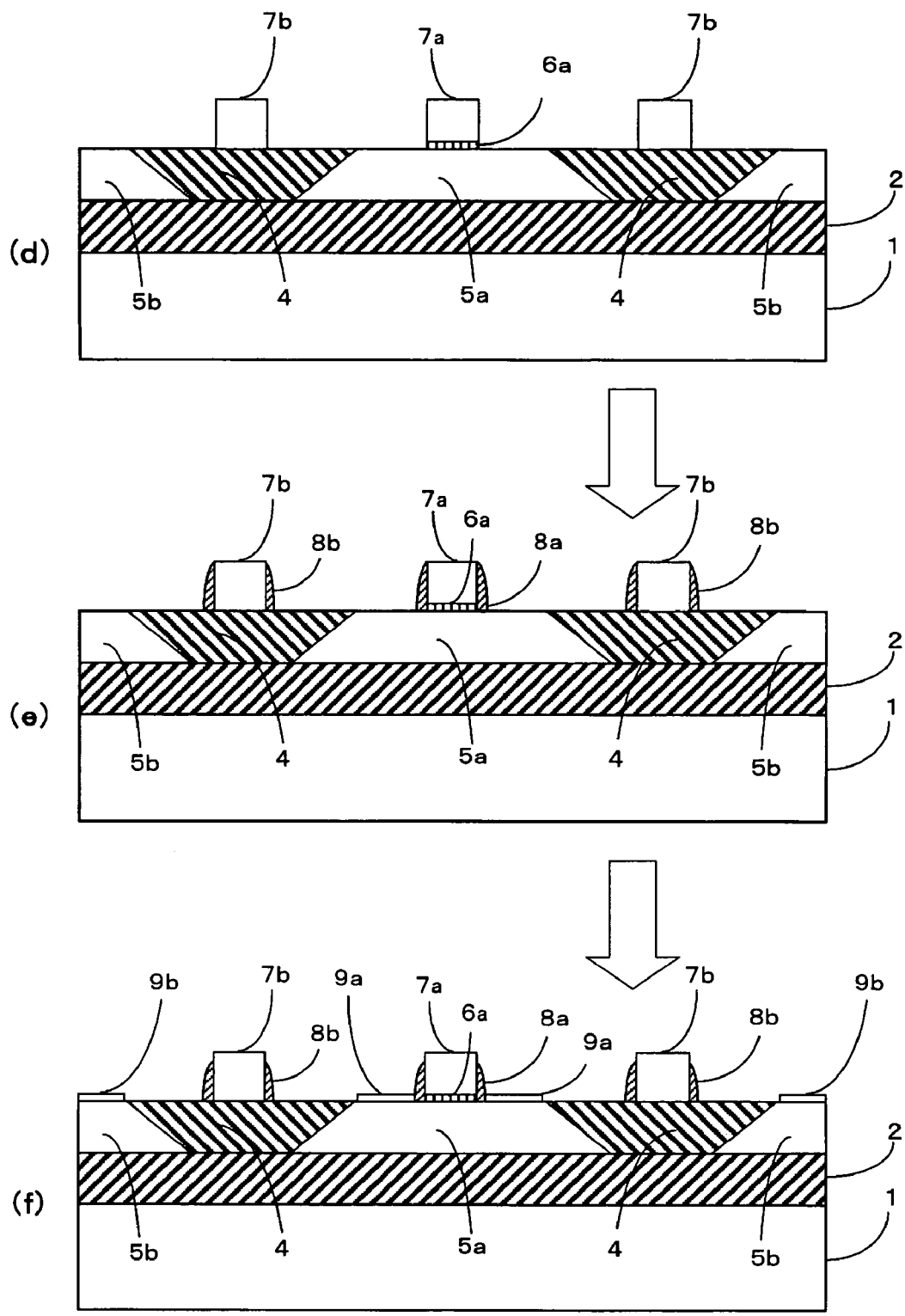
FIG. 10 is a view of cross-section diagrams further illustrating the method of making the semiconductor device in accordance with the third embodiment of the present invention.
Figure 11:
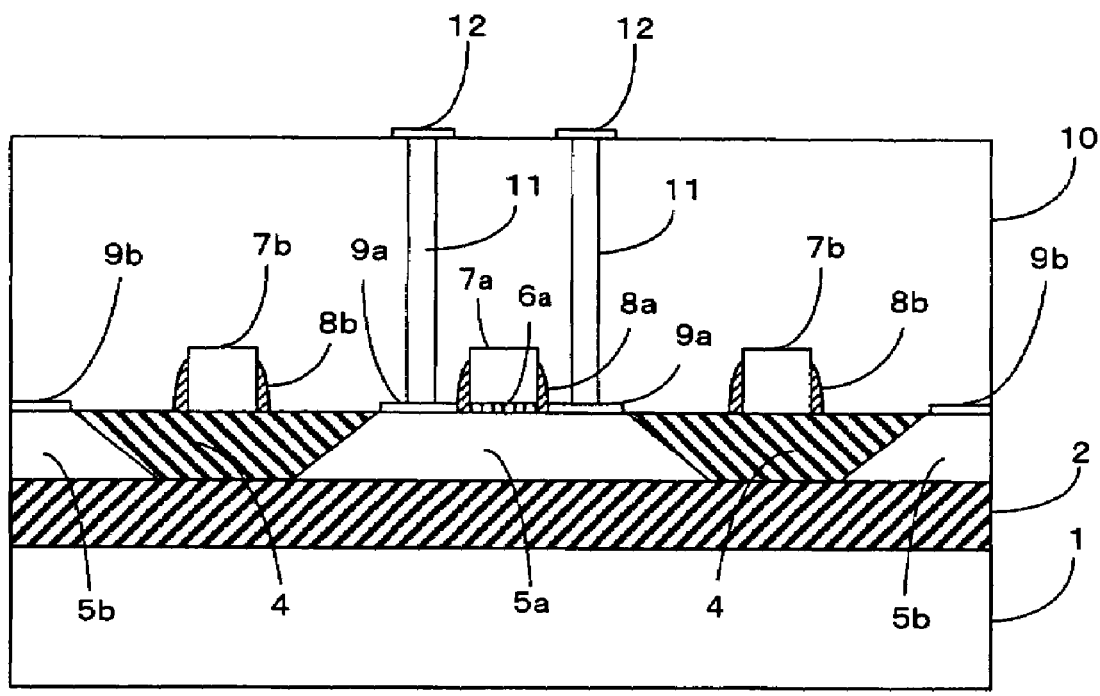
FIG. 11 is a view of a cross-section diagram illustrating the semiconductor device in accordance with the third embodiment of the present invention.

FIGS. 9 through 11 are cross-section diagrams used to explain a method of manufacturing an SOI semiconductor device in accordance with the third embodiment of the present invention.

As shown in line (a) of FIG. 9, an SOI substrate that is identical or similar to that of the first embodiment of the present invention is prepared.

Next, as shown in line (b) of FIG. 9, a device-separation insulating film 4 is formed in a semiconductor layer 3 and a device region 5a and a pseudo region 5b are formed preferably in the same way as those of the second embodiment of the present invention.

Next, as shown in line (c) of FIG. 9, insulating films 6a and 6b that are made of silicon oxide are respectively formed on the surface of the device region 5a and the pseudo region 5b. Further, a polysilicon layer 7 is deposited by a CVD method. The insulating films 6a and 6b are formed by a thermal oxidation method.

Next, as shown in line (d) of FIG. 10, a gate insulating film 6a, a gate electrode 7a, and a pseudo electrode 7b are formed by patterning the polysilicon 7 and the insulating films 6a and 6b.

As described above, an upper side of the gate electrode 7a and a part of the device region 5a that is exposed on both sides of the gate insulating film 6a and is changed to a source drain region are an area of exposed silicon. The area of exposed silicon is compensated by forming the pseudo region 5b and the pseudo electrode 7b if an exposed area of an upper side of the gate electrode 7a and a part of the device region 5a that is exposed on both sides of the gate insulating film 6a cannot sufficiently realize the desired growth rate. That is, an exposed area of the pseudo region 5b and the pseudo electrode 7b are adjusted so that the area of exposed silicon that an upper side of the gate electrode 7a, a part of the device region 5a that is exposed on both sides of the gate insulating film 6a, the pseudo region 5b, and the pseudo electrode 7b that are combined can a realize desired growth rate in low-temperature epitaxial growth in a later step. The layout and area of the pseudo region 5b and the pseudo electrode 7b are decided so that the pattern ratio required to realize the prescribed growth rate can be obtained.

Also, if the density of exposed silicon varies from place to place on an identical chip, an identical wafer, or plurality of wafers on which an identical epitaxial growth is conducted, the area of exposed silicon is adjusted according to places by the pseudo region 5b and the pseudo electrode 7b so that the density of exposed silicon can be uniform on the identical chip, the identical wafer, or plurality of wafers and the pattern ratio to realize the desired growth rate can be obtained. The layout and area of the pseudo region 5b and the pseudo electrode 7b are decided so that the density of exposed silicon is uniform on an identical chip, an identical wafer, or plurality of wafers, and the pattern ratio to realize the desired growth rate can be obtained.

Next, as shown in line (e) of FIG. 10, sidewalls 8a and 8b are respectively formed on sides of the gate electrode 7a and the pseudo electrode 7b by depositing a silicon nitride film or a silicon oxide film using a CVD method and then conducting etch back.

Next, as shown in line (f) of FIG. 10, an epitaxial layer 9a is formed on a surface of a part of the device region 5a that is exposed on both sides of the gate insulating film 6a, and an epitaxial layer 9b is formed on the surface of the pseudo region 5b by conducting epitaxial growth of silicon on the surface of a part of the device region 5a that is exposed on both sides of the gate insulating film 6a and the surface of the pseudo region 5b. The epitaxial layer 9a is formed to increase thickness of a source drain region and reduce sheet resistance. Epitaxial growth is preferably conducted using the growth conditions that are used in the first embodiment of the present invention.

As described above, the pattern ratio of silicon on the substrate pattern is adjusted by the pseudo region 5b and the pseudo electrode 7b in this epitaxial growth. Therefore, it is possible to control the growth rate of silicon and set it to a desired rate. In addition, if the density of exposed silicon varies from place to place on an identical chip, an identical wafer, or plurality of wafers in which an identical epitaxial growth is conducted, the area of exposed silicon is adjusted by the pseudo region 5b and the pseudo electrode 7b so that the density of exposed silicon can be uniform on an identical chip, an identical wafer, or plurality of wafers, and the pattern ratio to realize the desired growth rate can be obtained. Accordingly, it is possible to grow the epitaxial layer 9a with a uniform film thickness at a uniform and desired growth rate on the identical chip, the identical wafer, or plurality of wafers.

Next, a source drain region is formed on both sides of a gate insulating film 6a by implanting impurity ions into the epitaxial layer 9a and heat-treating it.

Then, as shown in FIG. 11, an inter-layer insulating film 10 is formed by depositing silicon oxide or silicon nitride using a CVD method, and an opening that exposes the source drain region is formed. Further, at least one contact plug 11 that is connected to the source drain region is formed, and a wiring pattern 12 that is connected to the contact plug 11 is formed.

According to the SOI semiconductor device in accordance with the third embodiment of the present invention, it is possible to control the growth rate and set it to a desired rate by adjusting the area of exposed silicon on the substrate pattern, that is, the area ratio of silicon (pattern ratio) by the pseudo region 5b and the pseudo electrode 7b in low-temperature epitaxial growth to reduce sheet resistance.

Further, if the density of exposed silicon varies from place to place on an identical chip, an identical wafer, or plurality of wafers in which an identical epitaxial growth is conducted, the area of exposed silicon is adjusted by the pseudo region 5b and the pseudo electrode 7b so that the density of exposed silicon can be uniform on the identical chip, the identical wafer, or plurality of wafers and the pattern ratio to realize the desired growth rate can be obtained. Accordingly, it is possible to grow the epitaxial layer 9a with a uniform film thickness at a uniform and desired growth rate on the identical chip, the identical wafer, or plurality of wafers.

Also, the growth rate in low-temperature epitaxial growth is controlled by adjusting the area of exposed silicon with both the pseudo region 5b and the pseudo electrode 7b in the third embodiment of the present invention. Therefore, a way of adjusting the area of exposed silicon used in the third embodiment has more flexibility compared to a way of adjusting the area of exposed silicon with either the pseudo region 5b or the pseudo electrode 7b.

Fourth Embodiment

In a fourth preferred embodiment of the present invention, an area of exposed silicon is adjusted by forming a pseudo region on a device-separation insulating film.

Figure 12:
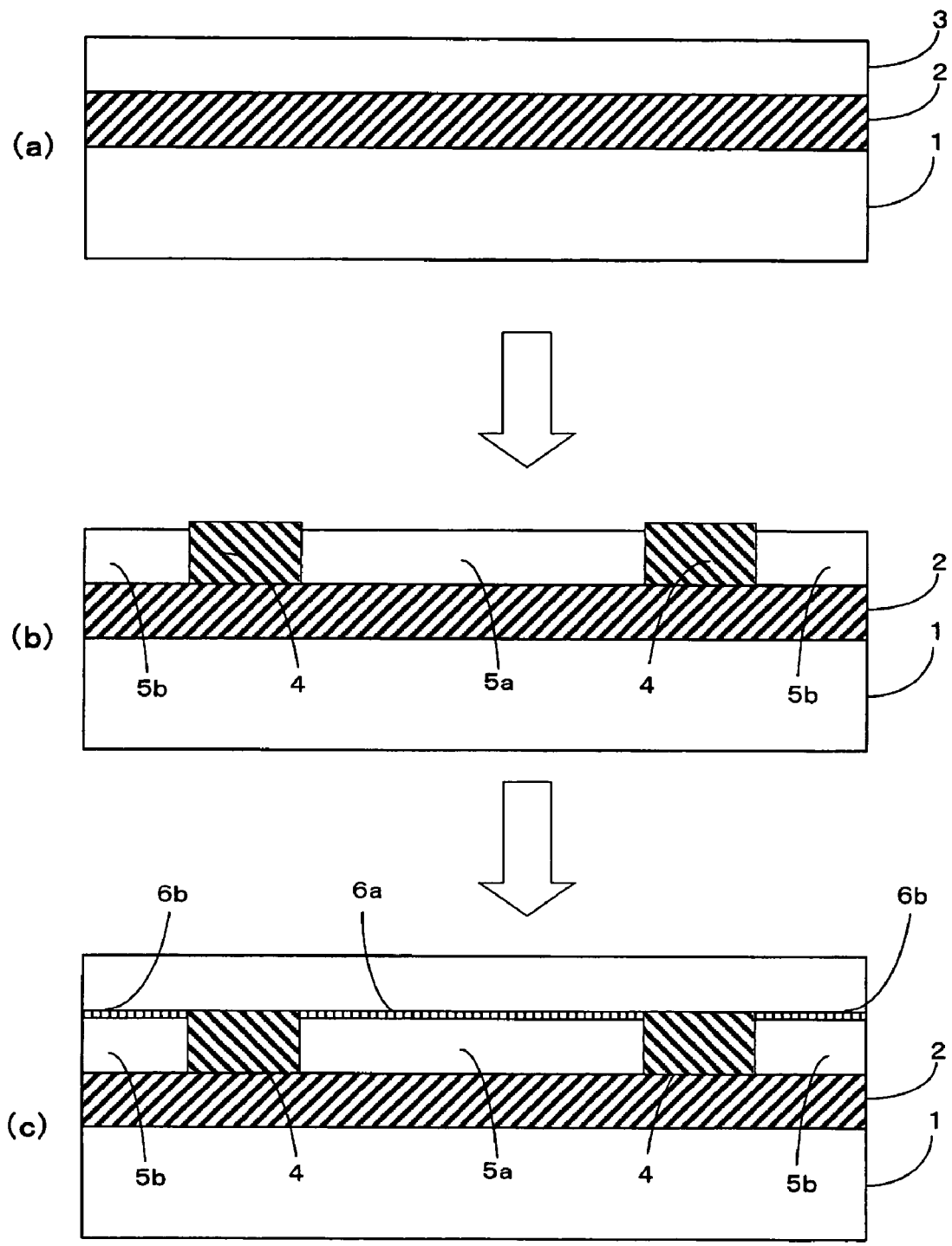
FIG. 12 is a view of cross-section diagrams illustrating a method of making the semiconductor device in accordance with a fourth embodiment of the present invention.
Figure 13:
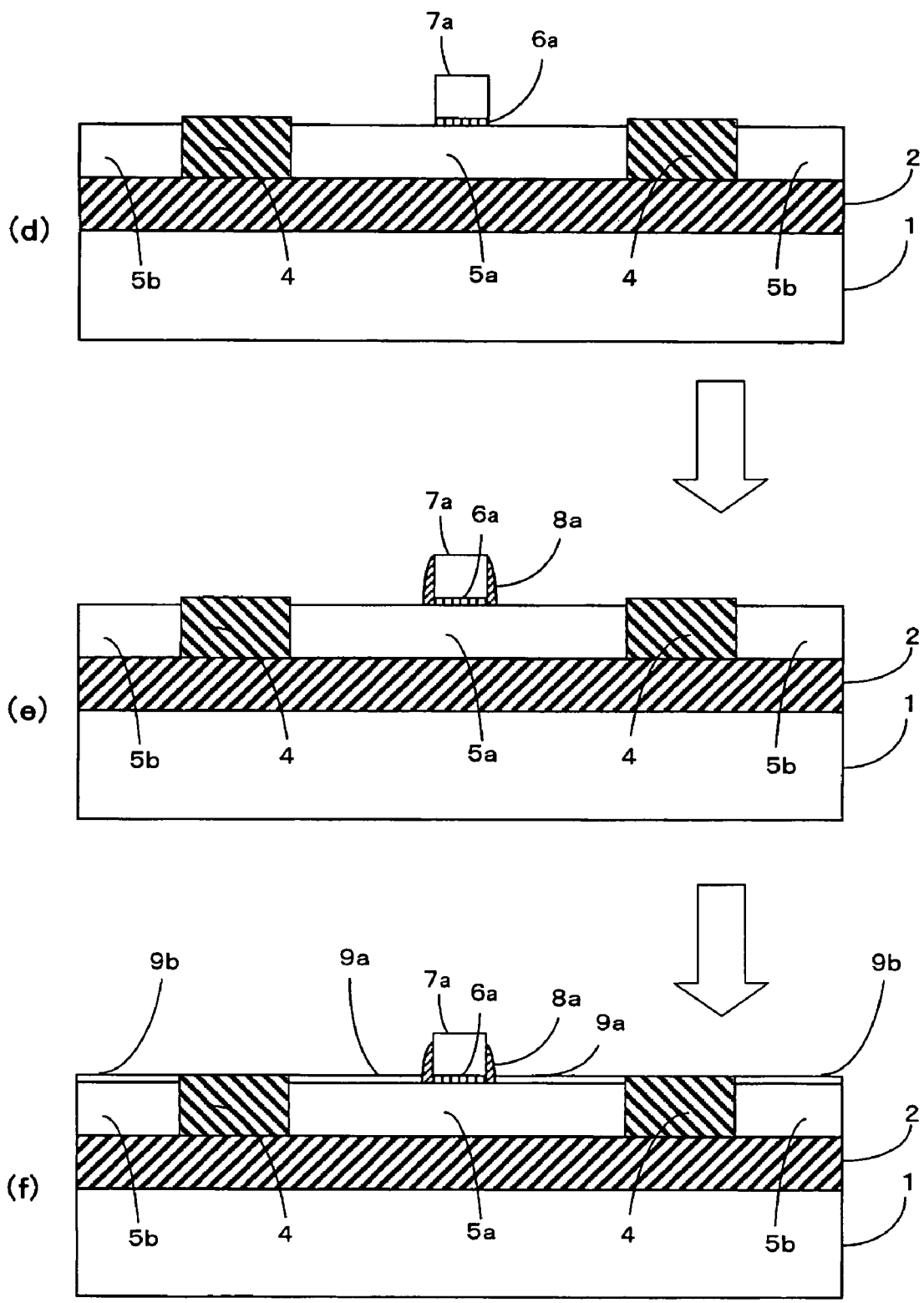
FIG. 13 is a view of cross-section diagrams further illustrating the method of making the semiconductor device in accordance with the fourth embodiment of the present invention.
Figure 14:
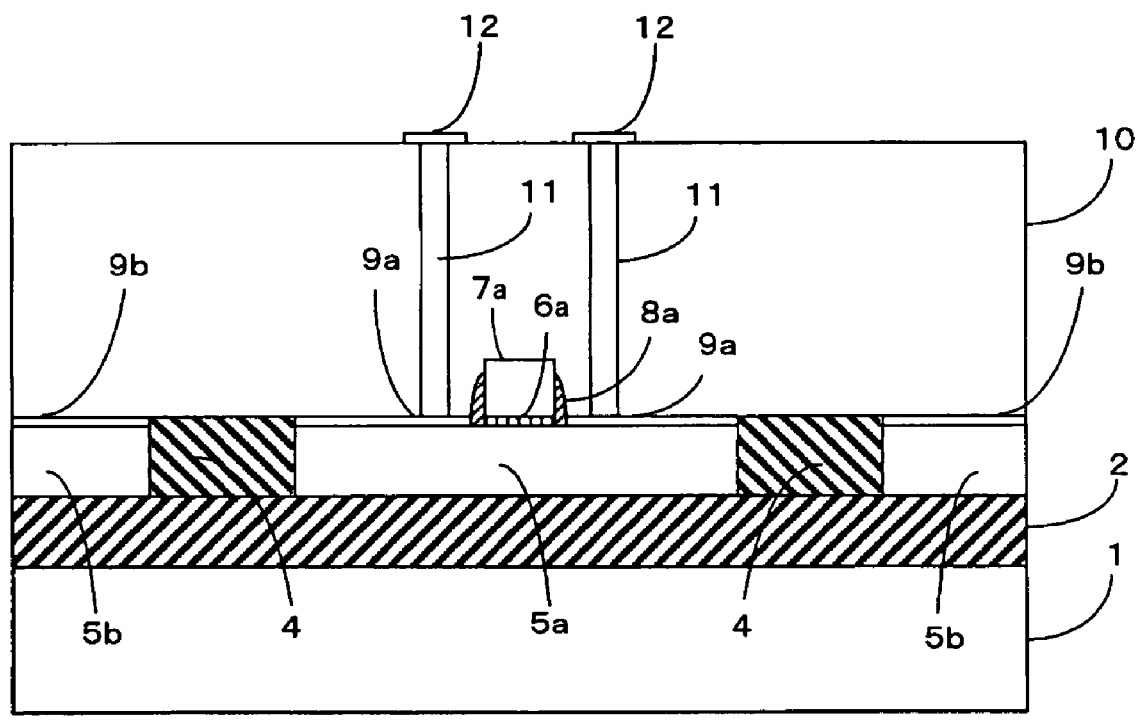
FIG. 14 is a view of a cross-section diagram illustrating the semiconductor device in accordance with the fourth embodiment of the present invention.

FIGS. 12 through 14 are cross-section diagrams used to explain a method of manufacturing an SOI semiconductor device in accordance with the fourth embodiment of the present invention.

As shown in line (a) of FIG. 12, an SOI substrate that is identical or similar to the one that is used in the first embodiment of the present invention is prepared.

Next, as shown in line (b) of FIG. 12, a device-separation insulating film 4 is formed by locally burying an insulating film into a semiconductor layer 3 by a heretofore known Shallow Trench Isolation (STI) method. As an example of device separation by the STI method, the following steps are conducted. A pattern, which is made of a nitride film exposing a forming region of a device separation insulating film 4 on a semiconductor layer 3, is formed. Further, a trench is formed by conducting etching for the semiconductor layer 3 with a nitride film as a mask, and silicon oxide is deposited so that the trench can be filled. Then, planarization is conducted using a CMP method so that silicon oxide can remain only inside the trench, and a nitride film is removed by wet etching. In the STI method, a device region 5a and a pseudo region 5b are formed by forming the device separation insulating film 4. The device region 5a is a region in which an MOS transistor is formed, and the pseudo region 5b is a region that is not required to operate the semiconductor device and the MOS transistor is not formed therein.

Next, as shown in line (c) of FIG. 12, insulating films 6a and 6b that are made of silicon oxide are formed on the surface of the device region 5a and the pseudo region 5b, and a poly-silicon layer 7 is deposited by a CVD method. The insulating films 6a and 6b are preferably formed by a thermal oxidation method.

Next, as shown in line (d) of FIG. 13, a gate insulating film 6a and a gate electrode 7a are formed by conducting patterning of the polysilicon layer 7 and insulating films 6a and 6b.

Next, as shown in line (e) of FIG. 13, a sidewall 8a is formed on the side of the gate electrode 7a by depositing a silicon nitride film or a silicon oxide film by a CVD method and then conducting etch back.

As described above, an upper side of the gate electrode 7a, and a part of the device region 5a that is exposed on both sides of the gate insulating film 6a and is changed to a source drain region are an area of exposed silicon. The area of exposed silicon is compensated by forming the pseudo region 5b if the exposed area of an upper side of the gate electrode 7a and a part of the device region 5a that is exposed on both sides of the gate insulating film 6a cannot sufficiently realize the desired growth rate. That is, the exposed area of the pseudo region 5b is adjusted so that the area of exposed silicon, which an upper side of the gate electrode 7a, a part of the device region 5a that is exposed on both sides of the gate insulating film 6a, and the pseudo region 5b are combined, can realize desired growth rate in low-temperature epitaxial growth in a later step. The layout and area of the pseudo region 5b are determined so that the density of exposed silicon can be uniform on an identical chip, an identical wafer, or plurality of wafers and the pattern ratio required to realize desired growth rate can be obtained.

Further, if the density of exposed silicon varies from place to place on an identical chip, an identical wafer, or plurality of wafers in which an identical epitaxial growth is conducted, the area of exposed silicon is adjusted by the pseudo region 5b according to places so that the density of exposed silicon is uniform on the identical chip, the identical wafer, or plurality of wafers and the pattern ratio to realize the desired growth rate can be obtained. The layout and area of the pseudo region 5b are determined so that the density of exposed silicon can be uniform on the identical chip, the identical wafer, or plurality of wafers and the pattern ratio to realize the desired growth rate can be obtained.

Next, as shown in line (f) of FIG. 13, epitaxial growth of silicon is conducted on the surface of a part of the device region 5a that is exposed on both sides of the gate insulating film 6a and the surface of the pseudo region 5b. Further, an epitaxial layer 9a is formed on the surface of a part of the device region 5a that is exposed on both sides of the gate insulating film 6a, and an epitaxial layer 9b is formed on surface of the pseudo region 5b. The epitaxial layer 9a is formed to increase thickness of a source drain region and reduce sheet resistance. Epitaxial growth is preferably conducted using the growth conditions that are used in the first embodiment of the present invention.

As described above, the pattern ratio of silicon on the substrate pattern is adjusted by the pseudo region 5b in this epitaxial growth. Therefore, it is possible to control the growth rate and set it to a desired rate. Further, if the density of exposed silicon varies from place to place on an identical chip, an identical wafer, or plurality of wafers on which an identical epitaxial growth is conducted, an area of exposed silicon is adjusted by the pseudo region 5b so that the density of exposed silicon can be uniform on an identical chip, an identical wafer, or plurality of wafers and the pattern ratio to realize the desired growth rate can be obtained. Accordingly, it is possible to grow an epitaxial layer 9a with uniform film thickness at a uniform and desired growth rate on the identical chip, the identical wafer, or plurality of wafers.

Next, a source drain region is formed on both sides of the gate insulating film 6a by implanting impurity ions into the epitaxial layer 9a and heat-treating it.

Then, as shown in FIG. 14, an inter-layer insulating film 10 is formed by depositing silicon oxide or silicon nitride by a CVD method, and an opening that exposes a source drain region is formed. Further, at least one contact plug 11 that is connected to the source drain region is formed, and a wiring pattern 12 that is connected to the contact plug 11 is formed.

According to an SOI semiconductor device in accordance with the fourth embodiment of the present invention, it is possible to control the growth rate and set it to a desired rate, by adjusting the area of exposed silicon that is exposed on the substrate pattern, that is, the area ratio of silicon (pattern ratio) with the pseudo region 5b in low-temperature epitaxial growth to reduce sheet resistance.

Further, if density of exposed silicon varies from place to place on an identical chip, an identical wafer, or plurality of wafers on which an identical epitaxial growth is conducted, the area of exposed silicon is adjusted by the pseudo region 5b so that density of exposed silicon can be uniform on the identical chip, the identical wafer, or plurality of wafers and the pattern ratio to realize the desired growth rate can be obtained. Accordingly, it is possible to grow the epitaxial layer 9a with a uniform film thickness at a uniform and desired growth rate on the identical chip, the identical wafer, or plurality of wafers. Moreover, it is possible to adjust the area of exposed silicon and control the growth rate in low-temperature epitaxial growth only by forming the pseudo region 5b.

Fifth Embodiment

In a fifth preferred embodiment of the present invention, an area of exposed silicon is adjusted by forming both a pseudo electrode and a pseudo region on a device-separation insulating film.

Figure 15:
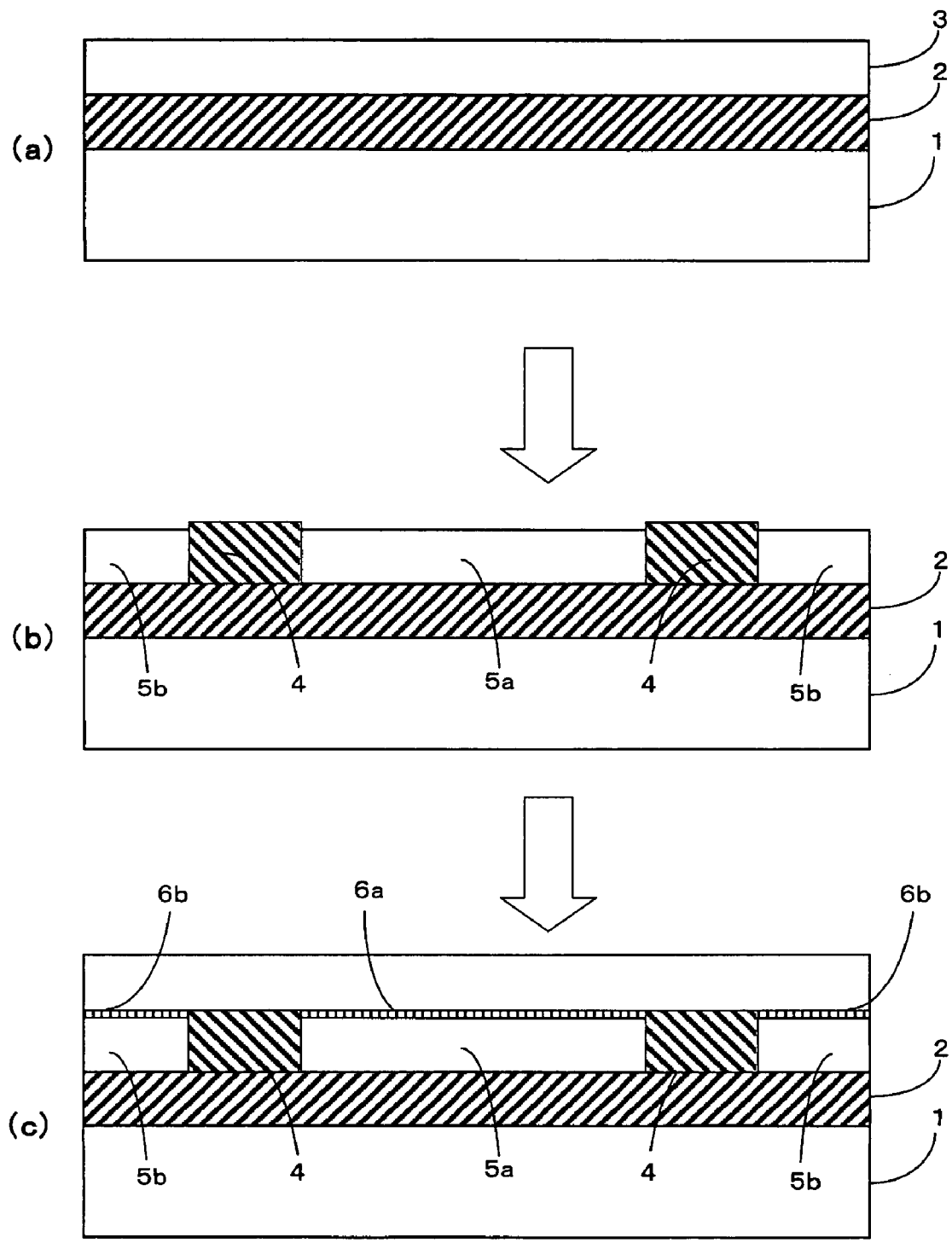
FIG. 15 are cross-section diagrams illustrating a method of making a semiconductor device in accordance with a fifth embodiment of the present invention.
Figure 16:
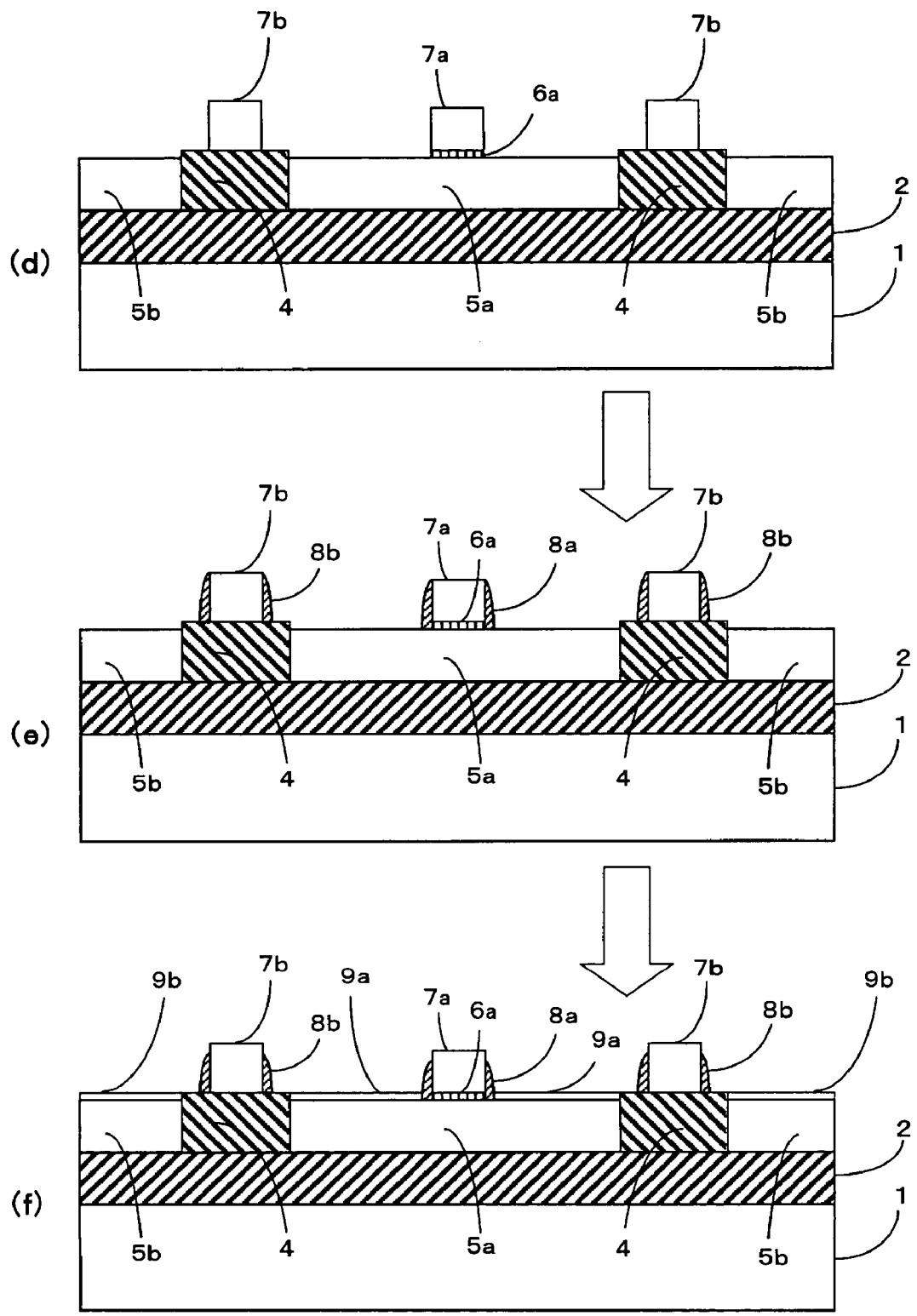
FIG. 16 is a view of cross-section diagrams further illustrating the method of making the semiconductor device in accordance with the fifth embodiment of the present invention.
Figure 17:
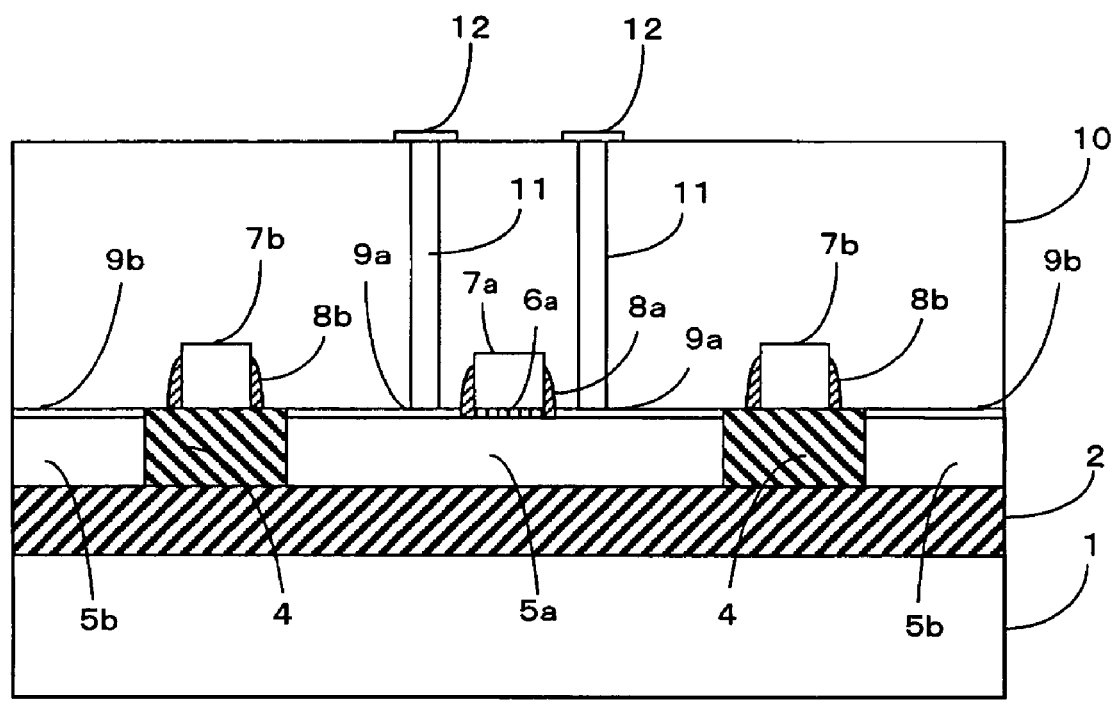
FIG. 17 is a view of a cross-section diagram illustrating the semiconductor device in accordance with the fifth embodiment of the present invention.

FIGS. 15 through 17 are cross-section diagrams used to explain a method of manufacturing an SOI semiconductor device in accordance with the fifth embodiment of the present invention.

As shown in line (a) of FIG. 15 an SOI substrate that is identical or similar to the one that is used in the first embodiment of the present invention is prepared.

Next, as shown in line (b) of FIG. 15, a device-separation insulating film 4 is formed by locally burying an insulating film in a semiconductor layer 3d with the heretofore known STI method, and a device region 5a and a pseudo region or regions 5b are formed. The device region 5a is a region in which an MOS transistor is formed, and the pseudo region 5b is a region that is not required to operate a semiconductor device and an MOS transistor is not formed.

Next, as shown in line (c) of FIG. 15, insulating films 6a and 6b that are made of silicon oxide are formed on the surface of the device region 5a and the pseudo region 5b, and a polysilicon layer 7 is deposited by a CVD method. The insulating films 6a and 6b are formed by the thermal oxidation method.

Next, as shown in line (d) of FIG. 16, patterning of a polysilicon 7 and insulating films 6a and 6b is conducted, and a gate insulating film 6a, a gate electrode 7a, and a pseudo electrode 7b are formed.

As described above, an upper side of the gate electrode 7a and a part of the device region 5a that is exposed on both sides of the gate insulating film 6a and is changed to a source drain region are an area of exposed silicon. The area of exposed silicon is compensated by forming the pseudo region 5b and the pseudo electrode 7b if the exposed area of an upper side of the gate electrode 7a and a part of the device region 5a that is exposed on both sides of the gate insulating film 6a cannot sufficiently realize the desired growth rate. That is, the exposed area of the pseudo region 5b and the pseudo electrode 7b is adjusted, so that the area of exposed silicon, in which an upper side of the gate electrode 7a, a part of the device region 5a that is exposed on both sides of the gate insulating film 6a, the pseudo region 5b, and the pseudo electrode 7b are combined can realize the desired growth rate in low-temperature epitaxial growth in a later step. The layout and area of the pseudo region 5b and the pseudo electrode 7b are determined so that the pattern ratio required to realize the prescribed growth rate can be obtained.

In addition, if the density of exposed silicon varies from place to place on an identical chip, an identical wafer, or plurality of wafers, the area of exposed silicon is adjusted according to places by the pseudo region 5b and the pseudo electrode 7b so that the density of exposed silicon can be uniform on the identical chip, the identical wafer, or plurality of wafers and the pattern ratio to realize desired growth rate can be obtained. The layout and area of the pseudo region 5b and the pseudo electrode 7b are decided so that the density of exposed silicon can be uniform on the identical chip, the identical wafer, or plurality of wafers and the pattern ratio to realize desired growth rate can be obtained.

Next, as shown in line (e) of FIG. 16, sidewalls 8a and 8b are respectively formed on the side of the gate electrode 7a and the pseudo electrode 7b by depositing a silicon nitride film or a silicon oxide film with a CVD method and then conducting etch back.

Next, as shown in line (f) of FIG. 16, epitaxial growth of silicon is conducted on the surface of a part of the device region 5a that is exposed on both sides of the gate insulating film 6a and the surface of the pseudo region 5b. Further, an epitaxial layer 9a is formed on the surface of a part of the device region 5a that is exposed on both sides of the gate insulating film 6a, and an epitaxial layer 9b is formed on surface of the pseudo region 5b. The epitaxial layer 9a is formed to reduce sheet resistance by increasing thickness of a source drain. Epitaxial growth is preferably conducted using growth conditions that are used in the first embodiment of the present invention.

As described above, the pattern ratio of silicon on the substrate pattern is adjusted by the pseudo region 5b and pseudo electrode 7b. Therefore, it is possible to control the growth rate and set it to a desired rate. Further, if the density of exposed silicon varies from place to place on an identical chip, an identical wafer, or plurality of wafers for which an identical epitaxial growth is conducted, the area of exposed silicon is adjusted by the pseudo region 5b and the pseudo electrode 7b so that the density of exposed silicon can be uniform on the identical chip, the identical wafer, or plurality of wafers and the pattern ratio to realize the desired growth rate can be obtained. Accordingly, it is possible to grow an epitaxial layer 9a with uniform film thickness at a uniform and desired growth rate on the identical chip, the identical wafer, or plurality of wafers.

Next, a source drain region is formed on both sides of the gate insulating film 6a by implanting impurity ions into the epitaxial layer 9a and heat-treating it.

Then, as shown in FIG. 17, an interlayer insulating film 10 is formed by depositing either silicon oxide or silicon nitride with a CVD method, and an opening that exposes a source drain region is formed. Further, at least one contact plug 11 that is connected to the source drain region is formed, and a wiring pattern 12 that is connected to the contact plug 11 is formed.

According to the SOI semiconductor device in accordance with the fifth embodiment of the present invention, it is possible to adjust the area of exposed silicon on the substrate pattern, that is, the area ratio of silicon (pattern ratio) by the pseudo region 5b and the pseudo electrode 7b, and to control the growth rate and set it to a desired rate in low-temperature epitaxial growth to reduce sheet resistance.

Further, if the density of exposed silicon varies from place to place on an identical chip, an identical wafer, or plurality of wafers for which an identical epitaxial growth is conducted, the area of exposed silicon is adjusted by the pseudo region 5b and the pseudo electrode 7b so that the density of exposed silicon can be uniform on the identical chip, the identical wafer, or plurality of wafers and the pattern ratio to realize the desired growth rate can be obtained. Accordingly, it is possible to grow the epitaxial layer 9a with a uniform film thickness at a uniform and desired growth rate on the identical chip, the identical wafer, or plurality of wafers.

Moreover, the growth rate in low-temperature epitaxial growth is controlled by adjusting the area of exposed silicon with both the pseudo region 5b and the pseudo electrode 7b in the fifth embodiment of the present invention. Therefore, a way of adjusting the area of exposed silicon used in the fifth embodiment has more flexibility compared to a way of adjusting the area of exposed silicon with either the pseudo region 5b or the pseudo electrode 7b.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

This application claims priority to Japanese Patent Application No. 2004-055244. The entire disclosure of Japanese Patent Application No. 2004-055244 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method of manufacturing a semiconductor device comprising:
   preparing a substrate including a first insulating film and a first layer including a first region and a second region separated by said first region, said first layer being formed on said first insulating film, said first layer comprising a first substance;

forming a second insulating film in said first region in said first layer;

forming a third insulating film to expose a periphery of said second region on said second region;

forming a first electrode having said first substance on said third insulating film;

adjusting an exposed area of said first substance to a prescribed area by forming either a third region being formed on a surface of said second insulating film and being comprised of said first substance to expose a surface of said third region in an epitaxial growth, or said third region being buried in said second insulating film and being comprised of said first substance said surface of said third region being exposed in said epitaxial growth; and conducting epitaxial growth of said first substance on said first electrode, to expose said second region on a periphery of said third insulating film and said third region.

2. The method of manufacturing a semiconductor device according to claim 1, wherein forming said second insulating film includes a local oxidation of silicon method.

3. The method of manufacturing a semiconductor device according to claim 2, wherein adjusting said exposed area includes forming a pseudo electrode on said second insulating film, or forming a pseudo region buried in said second insulating film.

4. The method of manufacturing a semiconductor device according to claim 3, wherein adjusting said exposed area includes forming said pseudo electrode.

5. The method of manufacturing a semiconductor device according to claim 4, wherein said first substance is silicon, and silicon forming said second region is silicon single crystal, and silicon forming said first electrode is polycrystalline silicon.

6. The method of manufacturing a semiconductor device according to claim 5, wherein said first electrode is a gate electrode of an MOS transistor that operates in a full depletion layer.

7. The method of manufacturing a semiconductor device according to claim 3, wherein adjusting said exposed area includes forming said pseudo region.

8. The method of manufacturing a semiconductor device according to claim 7, wherein said first substance is silicon, and silicon forming said second region is silicon single crystal, and silicon forming said first electrode is polycrystalline silicon.

9. The method of manufacturing a semiconductor device according to claim 8, wherein said first electrode is a gate electrode of an MOS transistor that operates in a full depletion layer.

10. The method of manufacturing a semiconductor device according to claim 3, wherein adjusting said exposed area includes forming both said pseudo electrode and said pseudo region.

11. The method of manufacturing a semiconductor device according to claim 10, wherein said first substance is silicon, and silicon forming said second region is silicon single crystal, and silicon forming said first electrode is polycrystalline silicon.

12. The method of manufacturing a semiconductor device according to claim 11, wherein said first electrode is a gate electrode of an MOS transistor that operates in a full depletion layer.

13. The method of manufacturing a semiconductor device according to claim 1, wherein a pseudo region that is separated by said second insulating film and is comprised of said first substance is formed by forming said second insulating film with a shallow trench isolation method when forming said second insulating film, and adjusting said exposed area includes forming said pseudo region when forming said second insulating film.

14. The method of manufacturing a semiconductor device according to claim 13, wherein said first substance is silicon, and silicon forming said second region is silicon single crystal, and silicon forming said first electrode is polycrystalline silicon.

15. The method of manufacturing a semiconductor device according to claim 14, wherein said first electrode is a gate electrode of an MOS transistor that operates in a full depletion layer.

16. The method of manufacturing a semiconductor device according to claim 15, wherein adjusting said exposed area further includes forming a pseudo electrode on said second insulating film.

17. The method of manufacturing a semiconductor device according to claim 16, wherein said first substance is silicon, and silicon forming said second region is silicon single crystal, and silicon forming said first electrode is polycrystalline silicon.

18. The method of manufacturing a semiconductor device according to claim 17, wherein said first electrode is a gate electrode of an MOS transistor that operates in a full depletion layer.

* * * * *